(12) United States Patent
Berger et al.

(10) Patent No.: US 9,219,049 B2
(45) Date of Patent: Dec. 22, 2015

(54) COMPOUND STRUCTURE AND METHOD FOR FORMING A COMPOUND STRUCTURE

(71) Applicant: Infineon Technologies AG, Neubiberg (DE)

(72) Inventors: Rudolf Berger, Regensburg (DE); Guenther Ruhl, Regensburg (DE); Wolfgang Lehnert, Lintach (DE); Roland Rupp, Lauf (DE)

(73) Assignee: Infineon Technologies AG, Neubiberg (DE)

( * ) Notice: Subject to any disclaimer, the term of this patent is extended or adjusted under 35 U.S.C. 154(b) by 77 days.

(21) Appl. No.: 14/105,414

(22) Filed: Dec. 13, 2013

(65) Prior Publication Data
US 2015/0171045 A1    Jun. 18, 2015

(51) Int. Cl.
H01L 23/52 (2006.01)
H01L 23/48 (2006.01)
H01L 21/46 (2006.01)
H01L 23/00 (2006.01)

(52) U.S. Cl.
CPC ............... *H01L 24/33* (2013.01); *H01L 24/83* (2013.01); *H01L 2224/32225* (2013.01); *H01L 2224/83055* (2013.01); *H01L 2224/83099* (2013.01); *H01L 2224/83851* (2013.01); *H01L 2224/83855* (2013.01); *H01L 2924/1026* (2013.01)

(58) Field of Classification Search
CPC .................... H01L 24/33; H01L 24/83; H01L 2224/32225; H01L 2224/83855
USPC .......................................... 257/782; 438/455
See application file for complete search history.

(56) References Cited

U.S. PATENT DOCUMENTS 6,867,067 B2 *  3/2005  Ghyselen et al. ............. 438/107
2010/0255289 A1 * 10/2010  Lewinsohn et al. ........... 428/325
2012/0083098 A1   4/2012  Berger et al.

OTHER PUBLICATIONS

"Pure CVD Silicon Carbide Wafer Carriers"; Engineer Live; Dec. 12, 2013; http://www.engineerlive.com/content/22721; p. 1-2.
"Reversibile Wafer Bonding and Backside Processing of GaAs (Cover Story Processing)"; http://www.mpi-halle.mpg.de/mpi/publi/pdf/669_01.pdf; Dec. 12, 2013; p. 1-4.

* cited by examiner

*Primary Examiner* — Luan C Thai
(74) *Attorney, Agent, or Firm* — Eschweiler & Associates, LLC

(57) ABSTRACT

A compound structure including a carrier wafer and at least one semiconductor piece bonded onto the carrier wafer by a bonding material obtained by a ceramic-forming polymer precursor.

22 Claims, 5 Drawing Sheets

Bonding at least one semiconductor piece onto a carrier wafer by using a ceramic-forming polymer

41

COMPOUND STRUCTURE AND METHOD FOR FORMING A COMPOUND STRUCTURE

FIELD

Embodiments described herein relate to compound structures being bonded with certain bonding material and a method for forming a compound structure. Further embodiments relate to compound structures containing a plurality of semiconductor pieces bonded onto a carrier wafer.

BACKGROUND

Non-Silicon semiconductor wafers, e.g. made of silicon carbide (SiC), gallium arsenide (GaAs), gallium nitride (GaN) are not yet manufactured in sizes such as those currently used in production lines for processing silicon wafers.

As an example, for SiC the currently common size is 100 mm, whereas 150 mm wafers are becoming available. In the silicon manufacturing, sizes of 200 mm and 300 mm are common. Because of the technically much more difficult crystal growing, it is not expected that the wafer sizes of non-silicon semiconductors will obtain the sizes of silicon. In addition, SiC is very expensive compared to silicon (Si) wafers.

Since non-silicon and silicon wafers are not produced in the same size and not processed in the same production lines, they are either processed in separate production lines or costly adjustments to the manufacturing facilities have to be made. Both involve high costs.

SUMMARY

An embodiment relates to a compound structure comprising a carrier wafer and at least one semiconductor piece bonded onto the carrier wafer by a bonding material obtained by a ceramic-forming polymer precursor.

Some embodiments relate to a method for forming a compound structure, the method comprising bonding at least one semiconductor piece onto a carrier wafer by using a ceramic-forming polymer precursor.

In some embodiments, a compound structure comprising a carrier wafer and at least two semiconductor pieces bonded onto the carrier wafer. The at least two semiconductor pieces are arranged laterally distributed on the carrier wafer.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
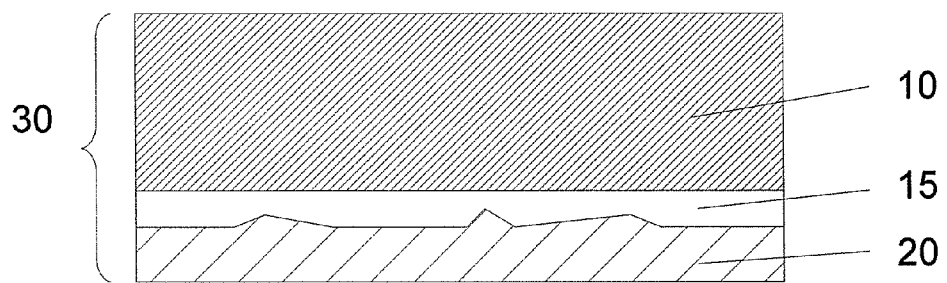
FIG. 1 shows a schematic cross section through a compound structure.

With reference to FIG. 1, a first embodiment of a compound structure 30 is described, containing a carrier wafer 20, at least one semiconductor piece 10, bonded onto the carrier wafer by a bonding material 15 obtained by (e.g. using adhesive bonding) a ceramic-forming polymer precursor.

One or more semiconductor pieces, or one single semiconductor wafer or a plurality of them (but not excluding other arrangements) may be arranged and fixed on the carrier wafer. The carrier wafer is a wafer, which is suitable to have semiconductor pieces bonded on it.

The carrier wafer may be robust, easy to handle and/or cheap, while a semiconductor wafer, or pieces thereof may be fragile, difficult to handle, not to be handled within standard processes and/or expensive. Due to desired (e.g. electrical) features of the semiconductor material or for reducing the quantity of needed material, due to expenses, these wafers might become very thin, often too thin to handle within fabrication processes with a higher likelihood of accidentally breaking. Fixing these semiconductor pieces on carrier wafers may give them the necessary support. Brittle non-silicon semiconductors such as GaAs or GaN may be less likely to break when bonded on a carrier wafer.

Fixing may be accomplished by bonding the carrier wafer and the at least one semiconductor piece together, in particular with an adhesive bonding technique. In this connection, the usage of a ceramic-forming polymer precursor is proposed. For example, the bonding may be carried out with a SiC ceramic-forming polymer precursor.

These polymers may contain organic precursors as an adhesive. In chemistry, a precursor may be a compound that participates in the chemical reaction that produces another compound.

By the use of an organic adhesive precursor (e.g. adhesive SiC precursors) as the adhesive material, thermal mismatch between the active layer and the bonding zone and the undesired forming of reaction zones between the bond layer and the active layer at high temperature processes may be avoided. The bonding material may be selected to provide a thermally stable layer.

The bonding material obtained by using a ceramic-forming polymer precursor may comprise an increased hydrogen portion remaining within the bonding material after bonding. For example, the bonding material may comprise more than 0.5% (or more than 1%, more than 2% or more than 5%) of hydrogen atoms or ions (e.g. percentage of atoms of the bonding material).

Further, the bonding material may comprise a poly-crystalline structure. For example, the bonding material comprises mainly (e.g. more than 50%, more than 70% or more than 90% of the grains) grains larger than 10 nm and smaller than 10 μm.

FIG. 1 shows a cross section through the bonding stack. The semiconductor piece or wafer 10 is bonded to the carrier wafer 20, by a thin bonding layer 15, which was formed by the polymer.

The polymer may comprise or consist (e.g. only) of carbon, silicon, hydrogen. When the hydrogen diffuses during the bonding process, only polycrystalline silicon carbide may remain. This may also work with GaAs.

The compound structure can serve as a donor wafer or structure in further steps. It is qualified for donating semiconductor layers from the at least one semiconductor piece. One or more semiconductor pieces (or small wafers) may donate at a time. Because these pieces are fixed on the carrier wafer, the arrangement may stay the same, when being donated appropriately (e.g. if fixed in the same arrangement like on the donor wafer at the moment of donation).

In an embodiment, the at least one semiconductor piece comprises or is a non silicon semiconductor substrate or a non single crystal silicon semiconductor substrate.

The semiconductor wafer can be made of or may comprise any semiconductor material suitable for manufacturing semiconductor devices. Examples of such materials include, without being limited thereto, besides elementary semiconductor materials such as silicon (Si), also non silicon materials like, group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above-mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

The following description focuses on SiC, although also other semiconductor materials may be used.

For example, hetero-epitaxy on silicon based material (e.g. GaN epitaxy on silicon) might appear as an option to the proposed bonding method.

In an embodiment, the carrier wafer contains graphite. Graphite wafers in semiconductor purity and suitable diameters (also large diameters) can be obtained at low prices.

Furthermore, graphite is highly temperature resistant, thus suitable for bonding with semiconductor materials having such high melting points, where other possible carrier substrates might not withstand. E.g. also quartz or sapphire might be suitable for bonding with GaAs.

A further aspect, to choose a suitable carrier material may be the similarity in thermal expansion during the tempering process. Graphite may be suitable for bonding to SiC from this aspect as well, for example.

The temperature stability of the composite wafer as described herein may be improved compared to the temperature stability of pure silicon wafers due to the thermal stability of graphite. Furthermore, graphite exhibits similar mechanical properties as Si and SiC and therefore does not interfere with these materials, for example. Graphite is also sufficiently mechanically stable to be suitable as a carrier material. Moreover, graphite is chemically inert against most or nearly all chemicals typically used in the semiconductor processing technology. Furthermore, graphite can be mechanically processed such as grinded, for example to form thin devices.

Other possible carrier materials might contain polycrystalline SiC for example.

After further processing, when the graphite wafer should be removed again, no care need be taken of the graphite carrier wafer. Because it is so cheap, it may simply be grinded off the semiconductor material.

In an embodiment the ceramic-forming polymer precursor contains allyl-hydrido-polycarbosilane.

The polymer allyl-hydrido-polycarbosilane may be suitable for bonding SiC on graphite, because it is suitable both for adhesive bonding and it is pyrolyzed to polycrystalline silicon carbide at high temperatures. Thus, the bonding layer between the SiC and the carrier wafer becomes SiC itself during the bonding process, thus omitting undesired side effects which might arise when using other types of material and furthermore assuring electrical connectivity, for example.

Before bonding, allyl-hydrido-polycarbosilane may be applied on one or both sides of the bonding surfaces (one or both of the surfaces of the semiconductor piece(s) and carrier wafer). This can be accomplished, e.g. by spin-on or spray processes.

Other polycarbosilanes may also be suitable for this purpose.

In an aspect only one semiconductor piece is bonded, which has substantially the same size as the carrier wafer. Size means the lateral extension or diameter of the wafer (while the semiconductor is a wafer itself in this case), not their thickness. The term "same size" also includes small deviations in size, e.g. resulting from production processes, when the wafers were formed. A deviation of less than one out of 10%, 5%, 2%, 1% or 0.5% between the diameters of the carrier and semiconductor wafers might count as the same size.

In an aspect only one semiconductor piece is bonded, having a smaller size than the carrier wafer. According to the above, a semiconductor piece more than one out of 0.5%, 1%, 2%, 5% or 10% smaller in area or diameter or longest lateral extension, compared with a size or a diameter of the carrier wafer, might count as smaller.

In an embodiment at least two semiconductor pieces are arranged laterally distributed on the carrier wafer.

The enlargement of the area or surface of the non-silicon semiconductor by bonding a plurality of wafers or suitable pieces onto a larger carrier wafer, allows handling and treatment of these wafers according to the carrier wafer's size, not to the size of the semiconductor pieces any more, for example.

Even fragments, segments, different or even arbitrary shapes, which can be arranged together on a single carrier wafer, may be bonded on the latter. For example, the semiconductor pieces are laterally distributed on the carrier wafer, but adjoined to each other where possible. In this way, the unused surface may be reduced (e.g. the surface of the carrier wafer, where no semiconductor surface is bonded onto). Thus even small pieces, like cutting remainders of e.g. valuable semiconductor substrate might be reused for production, for example.

In an embodiment a size of a surface of the at least one semiconductor piece is less than 90% of a size of a surface of the carrier wafer.

In an aspect, the size of the surface of the at least one semiconductor piece is less than one out of 20%, 30%, 50%, 70%, 90% of the size of the surface of the carrier wafer.

In an aspect, the maximum extension (e.g. maximal lateral dimension along the carrier wafer) of the semiconductor piece is 10% smaller than the maximum extension of the carrier wafer.

In an aspect, the maximum extension of the semiconductor piece is one out of 10%, 20%, 30%, 50%, 70%, 90% smaller than the maximum extension of the carrier wafer.

In an aspect, a size of the carrier wafer is a standard size (e.g. wafer diameter of 150 mm, 200 mm, 300 mm or 450 mm) for a production process.

Whole non-silicon semiconductor wafers or suitable (cut) pieces of non-silicon semiconductor wafers may be bonded onto this carrier wafer made e.g. of graphite, which corresponds to the same size and/or diameter of commonly used silicon wafers. Using a carrier wafer having a diameter of a standard size, allows non-silicon semiconductor bonded wafers in sizes, which are not possible for pure non-silicon semiconductors. Typical diameters sizes for silicon wafers may be 200 mm and 300 mm. However, the proposed measures work with future (larger) standard sizes of wafers as well.

Non-silicon semiconductor bonded wafers or suitable (cut) pieces of non-silicon semiconductor wafers can be processed in silicon semiconductor production lines, at which the production costs per unit of area are well below the cost of pure non-silicon semiconductor wafers.

Reduced wear may result for chip separation, since only the thin semiconductor layer (within about 20 micrometers) and the graphite, which is easy to work on, has to be sawed, for example. Depending on the production process when sawing, nothing or very little thickness of the graphite wafer may remain.

In an embodiment the at least one semiconductor piece comprises at least one straight edge at one side.

The surfaces of the donor wafer, where no semiconductor has been bonded and the cutting lines of appropriately cut and arranged semiconductor pieces on the carrier wafer, may correspond to the area on the wafer on which no functional components can be produced. This non-usable area may be very small in relation to the usable surface.

The semiconductor might feature a straight edge, by cutting or sawing a plane or straight edge accordingly. As well, several edges might be cut to form one piece of semiconductor. For example, starting from a round semiconductor wafer, one, two, three or four (or even more for a polygon) straight edges may be cut or sawed (e.g. resulting in a square or rectangular shape for four straight edges).

In an embodiment a crystal orientation of one of at least two semiconductor pieces bonded to the carrier wafer deviates less than 10° from a crystal orientation of the other semiconductor piece of the at least two semiconductor pieces.

For forming components in a later step, it may be important, to align the semiconductor pieces on the carrier wafer according to its crystal orientation. This rule may be applied to all semiconductor pieces bonded on the carrier wafer.

In an aspect, the crystal orientation between the at least two semiconductor pieces deviates less than one out of 10°, 5°, 2°, 1°, 0.1°.

Depending on the purpose of usage (e.g. the physical features of the later components) a larger deviation is more or less tolerable. Hence the deviation tolerance might differ according to the product.

In an example, exactly two semiconductor pieces are aligned laterally on the carrier wafer, facing their linear, thus forming a butterfly shape.

Figure 2:
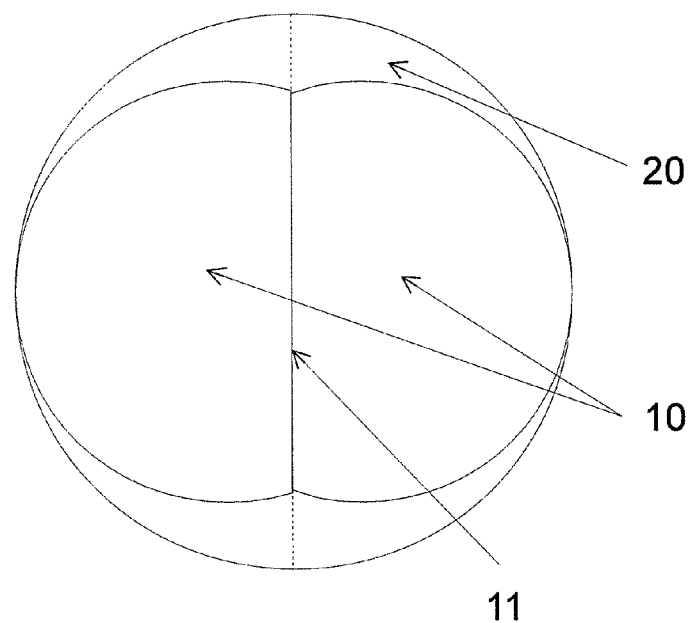
FIG. 2 shows an arrangement of two semiconductor pieces on a carrier wafer in a butterfly shape.

FIG. 2 shows an arrangement of two semiconductor pieces 10 on a carrier wafer 20, where previously a straight edge 11 was cut from two semiconductor wafers. These wafers 10 have a smaller size in diameter (e.g. 150 mm) than the carrier wafer 20 (e.g. 200 mm). The cuttings in this example were made to fit both semiconductor pieces onto the carrier wafer 20. Hence the cutting was performed on approximately ¾th of the diameter of the semiconductor wafers.

The straight edges are facing each other adjoining as illustrated. In this way, a waste of space may be reduced. A thin cut edge, closely aligned, may reduce the unused surface. Anyway, right on this edge, no components may be made.

Empty areas, which are not covered by semiconductor substrate can be used for orientation (markings like edges and notches) or handling purposes during the following fabrication process. Additionally, these empty areas could be filled up with even smaller semiconductor pieces.

The figure is to scale for the mentioned diameters (150 mm, 200 mm), for example.

In an aspect, exactly four semiconductor pieces, each having two rectangular arranged straight edges, are arranged in a way that each straight edge faces another straight edge, thus forming a four-leafed clover shape.

Figure 3:
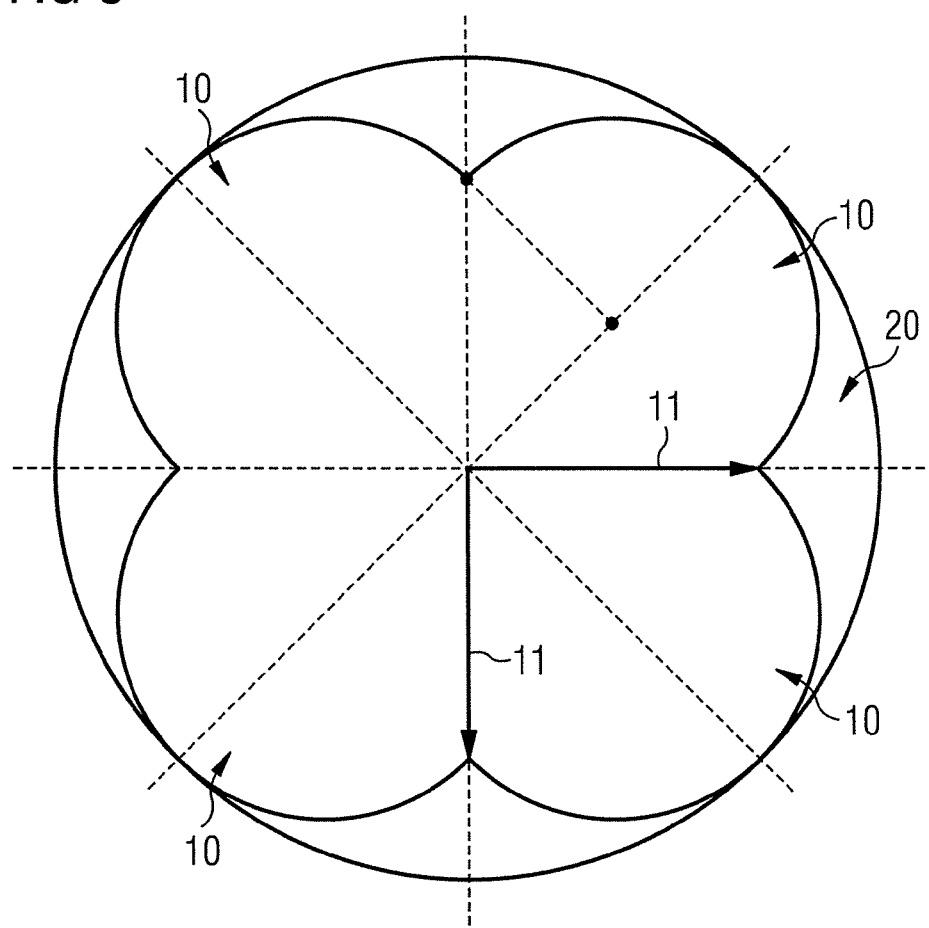
FIG. 3 shows an arrangement of two semiconductor pieces on a carrier wafer in a four-leafed clover shape.

FIG. 3 shows an arrangement of four semiconductor pieces 10 on a carrier wafer 20, where two edges 11 were cut from each of the four semiconductor wafers previously. These wafers 10 have a smaller size in diameter (e.g. 100 mm) than the carrier wafer 20 (e.g. 200 mm). The cuttings in this example were made to fit all four semiconductor pieces onto the carrier wafer. Therefore the cutting in this example forms a rectangular angle between the cuttings, leaving the whole diameter of the wafer measured from the tip of the rectangular angle, for example.

The figure is to scale for the mentioned diameters (100 mm, 200 mm), for example.

Furthermore, the non-silicon semiconductor wafers (here SiC with 100 mm wafer diameter) may be cut into segments in a way, that all the segments have substantially the same crystal orientation on the graphite wafer (disk diameter 200 mm here). The area loss of non-silicon semiconductor through the according sawing results in a total of 28.54 cm$^2$ (equivalent to 18.2%), for example. The non-usable area on the graphite wafer is here 57 cm$^2$ (equivalent to 18.2%) plus the non-usable seam lines between the segments, for example.

In an aspect the at least two semiconductor pieces may be aligned in a way leaving blank the edge region of the carrier wafer.

Because the very thin semiconductor layer (e.g. made of SiC) might break easily or easier than other parts of the compound structure or donor wafer during handling in the manufacturing process, the semiconductor pieces might not be placed up to the carrier wafers edge. Brittle non-silicon semiconductors such as GaAs or GaN may break also less easily when not mechanically treated on the surfaces' edge, for example.

In an embodiment the at least two semiconductor pieces and the carrier wafer are electrically conductible connected through the bonding material obtained by adhesive bonding using a ceramic-forming polymer precursor.

For some fabrication processes, it may be desired to apply an electrical potential to the semiconductor substrate. Consequently, the compound structure may be formed with a certain amount of conductivity between the carrier wafer and the at least one semiconductor piece.

In an aspect, an adhesive material, which is used for the adhesive bonding, is electrically conductive or the adhesive bonding allows an electrically conductive connection between the semiconductor pieces and the carrier wafer. For this purpose, for example, a conductive bonding material, a bonding material, which leaves behind a conductive connection or doped bonding material might be used.

In some embodiments, a bonding material obtained by adhesive bonding using a ceramic-forming polymer precursor containing dopants of a predefined average dopant concentration may be used.

For example, doping of the ceramic bonding layer may lead to an electrical conductible bond between the mono crystal SiC wafer and the graphite substrate. This may cause a doping of the bond layer (e.g. polycrystalline SiC, which arises from the polymer) and optionally also a thin mono crystalline SiC layer of the at least one semiconductor piece during tempering, so that the vertical conductivity may be increased.

Possible average doping concentrations may be $1*10^{14}$ to $1*10^{16}$ dopants/cm$^3$.

In an embodiment the doping material is chemically bound to the polymer molecule as a functional group or as an independent compound blended with the polymer.

For forming an electrical conductive bond, dopants may be either bound chemically as functional groups to the polymer molecules or added to the polymer as separate compounds, for example.

In an aspect suitable doping material may comprise at least one of aluminum (Al), Nitrogen (N), phosphorus (P) or boron (B).

Figures 4, 5:
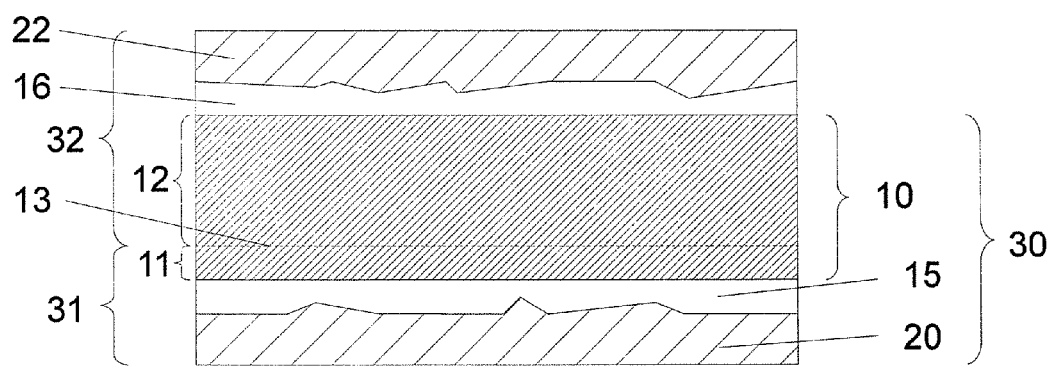
FIG. 4 shows a method for bonding the bonding stack.
FIG. 5 shows a transfer of a semiconductor layer to a second carrier wafer.

With reference to FIG. 4, a first embodiment of a method 41 for forming a compound structure is described, where at least one semiconductor piece is bonded onto a carrier wafer by a bonding material by adhesive bonding using a ceramic-forming polymer precursor. One or more semiconductor pieces, or one single semiconductor wafer or a plurality of semiconductor wafers may be arranged and fixed on the carrier wafer. Fixing may be accomplished by the step of bonding the carrier wafer and at least one semiconductor piece together, in particular with a step of adhesive bonding. For this, a ceramic-forming polymer precursor may be used. For example, the bonding may be carried out with a SiC ceramic-forming polymer precursor.

By the use of an organic adhesive precursor (e.g. adhesive SiC precursors) as the adhesive material, thermal mismatch between the active layer and the bonding zone and the undesired forming of reaction zones between bond layer and the active layer at high temperature processes may be avoided.

The polymer might comprise or consist (e.g. only) of carbon, silicon, hydrogen. When the hydrogen diffuses during the bonding process, only polycristalline silicon carbide may remain. This may also work with GaAs.

The compound structure can serve as a donor wafer in further steps. It may be used for donating semiconductor layers from the at least one semiconductor pieces. In an aspect the forming by a ceramic-forming polymer precursor may be performed by using allyl-hydrido-polycarbosilan or another polycarbosilane.

In an embodiment one or both sides of the bonding surfaces are coated with the ceramic-forming polymer precursor, followed by tempering between 200 to 700° C.

As a first part of the bonding procedure, the polymer may be applied either to the carrier wafer or the at least one semiconductor piece (which is to be bonded). The bonding material can be applied on the surfaces of both, the carrier wafer and the semiconductor piece(s) as well. The according area of the surface, which is to be bonded, may be covered by the polymer. The polymer can be applied e.g. by spin-on or spray processes.

As a second part of the bonding procedure, the carrier wafer may be joined with the semiconductor piece(s) facing the sides, where the polymer was applied, thus forming a compound structure or wafer stack. The so joined substrates may be subjected to a heat treatment (tempering) to form a stable and durable bond between the carrier wafer and semiconductor piece(s).

After the joining, the wafer stack may be heated to form the bond. For example, temperatures ranges can be from about room temperature to about 600° C., or from 200-700° C.

In an aspect, tempering can include, tempering in a first temperature range and subsequently in a second temperature range which is different than the first temperature range. The second temperature range can encompass temperatures higher than the first temperature range. The second temperature range can be, for example, from about 500° C. to about 1000° C. or even higher.

When using allyl-hydrido-polycarbosilane, it may be pyrolyzed to polycrystalline silicon carbide at high temperatures of e.g. 1500° C.-1700° C. (e.g. for the complete conversion of the precursor layer into polycrystalline SiC). Thus, the bonding layer between the SiC and the carrier wafer may become SiC itself during the bonding process, thus omitting effects which might arise when using other types of material and furthermore assuring electrical connectivity, for example.

Furthermore, graphite (used as material for the carrier wafer) has a thermal expansion coefficient similar to that of SiC which may make graphite a promising carrier material for SiC. Graphite, however, may be also suitable for other semiconductor materials (e.g. silicon).

A strengthening of the bond, and the separation (see below) of the SiC donor wafer may occur at 700° C.-1800° C.

In an aspect, three tempering processes performed at different temperatures can be used. As a further aspect, the tempering processes can be combined into a single process having a given temperature profile. In an aspect, the tempering takes place under (compacting) pressure. This may apply for each or all of the tempering steps.

In an embodiment the tempering takes place in an atmosphere of nitrogen.

Alternatively, or additionally, the thin single crystal SiC layer may be doped by carrying out the step of tempering in a nitrogen atmosphere. Nitrogen is in SiC a low donor, for example.

Effectively, this may cause doping of the bond layer (e.g. polycrystalline SiC, which arises from the polymer) and the thin mono crystalline SiC layer during tempering, so that the vertical conductivity may be increased.

In an embodiment, the method further comprises equalization of the thickness of at least two semiconductor pieces, until a deviation of less than 0.5 μm among them is achieved.

It is to be remarked, that the thickness of the semiconductor pieces may vary. This might affect the assembly of semiconductor pieces on the graphite wafer, if the thickness of the pieces is different and above a tolerable deviation.

Single crystal SiC wafers may be delivered with thickness tolerances of +/−25 micrometers. When bonding at least two of these semiconductor pieces (e.g. made from these wafers), a deviation of the thickness of 50 μm might occur in the worst case. Then, the surface of the arranged pieces would not be in the same plane. This would prevent or harm a succeeding bonding process or other processes on this (the second) side/surface of the semiconductor pieces.

Hence it may be desired, that the deviation of the thicknesses is under a certain tolerance before bonding.

In an aspect, the maximum thickness deviation between the at least two semiconductor pieces is less than one out of 5 μm, 2 μm, 1 μm, 0.5 μm, 0.25 μm, 0.1 μm.

In an aspect, the maximum thickness of the at least two semiconductor pieces themselves is one out of 50 μm, 30 μm, 25 μm 20 μm, 10 μm, 5 μm, 2 μm, 1 μm.

These semiconductor pieces can be brought to an identical thickness (or a thickness deviation less than the tolerance), by epitaxial growth (before bonding to the carrier wafer). Also only one of the pieces can be treated to achieve the same thickness.

Other methods may involve thinning a semiconductor piece, like polishing.

Finally a very homogeneous thickness of the semiconductor layer formed by the semiconductor pieces may be achieved. The thickness might also be homogeneous between the semiconductor layers on different donor wafers, to assure equal conditions for further processing of the semiconductors, for example.

In an aspect, at least two semiconductor pieces with a deviation of the thickness of less than 0.5 μm among them are selected for bonding onto one carrier wafer. Instead of adapting the thickness of the involved semiconductor pieces, suitable pieces can be selected.

Therefore, pieces with nearly identical thicknesses may be used here. For this purpose, the thickness of the semiconductor pieces may be measured to be able to select pieces within a tolerable deviation of thickness.

In an aspect, the carrier wafer is treated by polishing and coating previous to the equalization. If necessary, the surface may be polished, to compensate for different heights.

In an aspect the method further contains a step of sawing of the at least one semiconductor piece previous to equalization or bonding.

In an embodiment, the method further comprises a step of transferring a semiconductor layer onto a second carrier wafer.

From the donor wafer thin semiconductor layers may be transferred to other carrier wafers, leaving a first compound structure and forming a second compound structure. One or both of these compound structures can serve as future donor wafers.

The first and second carrier wafer may have different sizes.

If the bonding material contains dopants, they might diffuse via the back side, when bonding the donor wafer to the second carrier wafer.

The donor wafer may be reused, the final (thin) wafer might be sawed, optionally the graphite may be removed and the wafer may be further processed.

The method shown in FIG. 4 may comprise one or more optional, additional acts corresponding to one or more aspects mentioned in connection with the proposed concept or one or more embodiments described above.

With reference to FIG. 5, in an embodiment the transfer is performed by bonding 16 the opposite side of the at least one semiconductor piece 10 onto a second carrier wafer 22 and splitting the at least one semiconductor piece along an internal splitting boundary 13 so that a part 11 of the at least one semiconductor piece remains on the first carrier wafer 20 and another part 12 of the at least one semiconductor piece remains on the second carrier wafer 22.

FIG. 5 depicts a compound structure 20, during transfer of a semiconductor layer 12 to a second carrier wafer 22. In a transfer process, gas ions such as protons may be implanted into the semiconductor piece(s) 10 into a given depth. The implantation depth can be adjusted by selecting the implantation energy. The implantation depth defines the thickness of the remaining semiconductor layer 11 on the first carrier wafer 20 as described further below.

The implantation of atoms or ions (e.g. protons), respectively, may cause the formation of a delamination layer 13 which can be a micro-bubble layer or micro-porous layer along the semiconductor piece(s) 10.

Thereafter, a second carrier wafer 22 is bonded on the free surface of the semiconductor piece(s) 10. For example, the bonding technique for this second bonding is the same like the one for the first bonding.

The composite wafer 30, which is joined with the second carrier wafer 22 may be subjected to a thermal treatment to process the bonding and to delaminate the semiconductor wafer 10 along the delamination layer 13 which may serve as a cleavage plane. The thermal treatment causes mechanical tensions which may result in a separation along the delamination layer. A comparably thin semiconductor layer 11 remains bonded to the carrier wafer 20 through bonding layer 15 forming a new first compound structure with a thinner thickness 31.

Semiconductor layer 11 has a thickness which was defined by the implantation energy of the gas ions, which may be one out of 5 μm, 2 μm, 1.5 μm, 1 μm, 0.8 μm, 0.5 μm, for example.

The delamination process may further lead to the formation of a second compound structure 32 which can be used again as a new donor wafer for manufacturing further composite wafers, as long as there is sufficient semiconductor substrate with a sufficient thickness 12 on the second compound structure 32.

The donor wafer may be repeatedly (e.g. more than 5 times or more than 10 times) usable as a donor, as they can be brought back to the initial state by polishing and epitaxy (see below), for example. This may be very cost-efficient and (e.g. for SiC).

Alternatively to the mentioned procedure, also other methods (e.g. oxygen implantation) may be suitable to separate and transfer the semiconductor layer.

In an aspect, the method may further contain a step of polishing and epitaxy treatment previous to the transfer.

Polishing of the surface might be used to compensate for different thicknesses of the semiconductor pieces. The initial thickness of the semiconductor layer of the donor wafer may be subsequently made by epitaxial growth.

In an embodiment, the method further comprises a step of depositing an epitaxial layer onto at least one of the remaining parts of the at least one semiconductor piece.

A further semiconductor layer can be epitaxially deposited on a part of the semiconductor piece(s) (semiconductor layer) to increase the total thickness of the crystalline semiconductor material disposed on the carrier wafer.

The necessary thickness of the semiconductor layer for forming electrical components may be subsequently made by epitaxial growth.

Before reuse, the new compound structures can be polished or etched to form a flat and defect-free surface.

Possibly the polishing and/or the epitaxial growth can be omitted, too.

Furthermore, an epitaxial layer (e.g. using specific dopants) can be formed on the semiconductor layer to tailor, for example, the doping concentration of the device layer. Epitaxial layer and semiconductor layer may form together the device layer.

In an aspect, the semiconductor layer has a thickness of one of 5 µm, 2 µm, 1 µm, 0.5 µm for starting with the epitaxial growth.

Using epitaxy may allow a more homogeneous crystalline pattern, than the original substrate. Further, less (thickness) of the original substrate (semiconductor) may be necessary, so the process of transferring thin layers of the semiconductor substrate can be repeated more often, for example.

In an embodiment one of the remaining parts of the at least one semiconductor piece has a predefined thickness according to a voltage class of a semiconductor device to be formed on the compound structure after depositing an epitaxial layer.

Depending on the semiconductor material, a certain thickness relates to a certain breakdown voltage. According to the desired voltage class of the later semiconductor device to be formed on the compound structure, the thickness may be chosen.

For SiC the breakdown voltage may increase by 100 volts for every micrometer of substrate thickness. The predefined thickness according to a voltage class may be calculated accordingly.

For a breakdown voltage of 1500V, a 15 µm thick semiconductor substrate may be used, for example.

In an aspect, the method further contains a step of forming electrical circuits on at least one part of the at least one semiconductor piece.

After manufacturing the compound structure, having a thin substrate of semiconductor material, fabrication of components may follow.

The graphite wafer can be grinding off or leaving bound to the formed semiconductor device. For example, it may give support to the semiconductor until chips are sawed or even when packaged.

Reuse of the graphite may be difficult or unnecessary due to cheap graphite prices. The graphite of the donor wafer may of course be reused, as long it is used for donation, for example. If after several donation procedures the semiconductor layer is thin enough for forming components, it may no longer serve as a donor wafer, for example.

In an example, (similar to the cross section through the compound structure shown in FIG. 1) the monocrystalline SiC wafer having a thickness of 1.01 µm is bonded to the graphite wafer by means of an approximately 70 nm thick polycrystalline SiC bonding layer, which was formed of the polycarbosilane (after transfer of the semiconductor layer).

In an aspect, the electrical circuits may be formed prior or without the transfer of a semiconductor layer to another carrier wafer, directly from the donor wafer. Then, the thickness will remain fairly the same as the one of the original semiconductor piece.

Alternatively, no delamination and separating of layers occurs, but the semiconductor substrate may be polished back to form a thin semiconductor layer.

Figure 6:
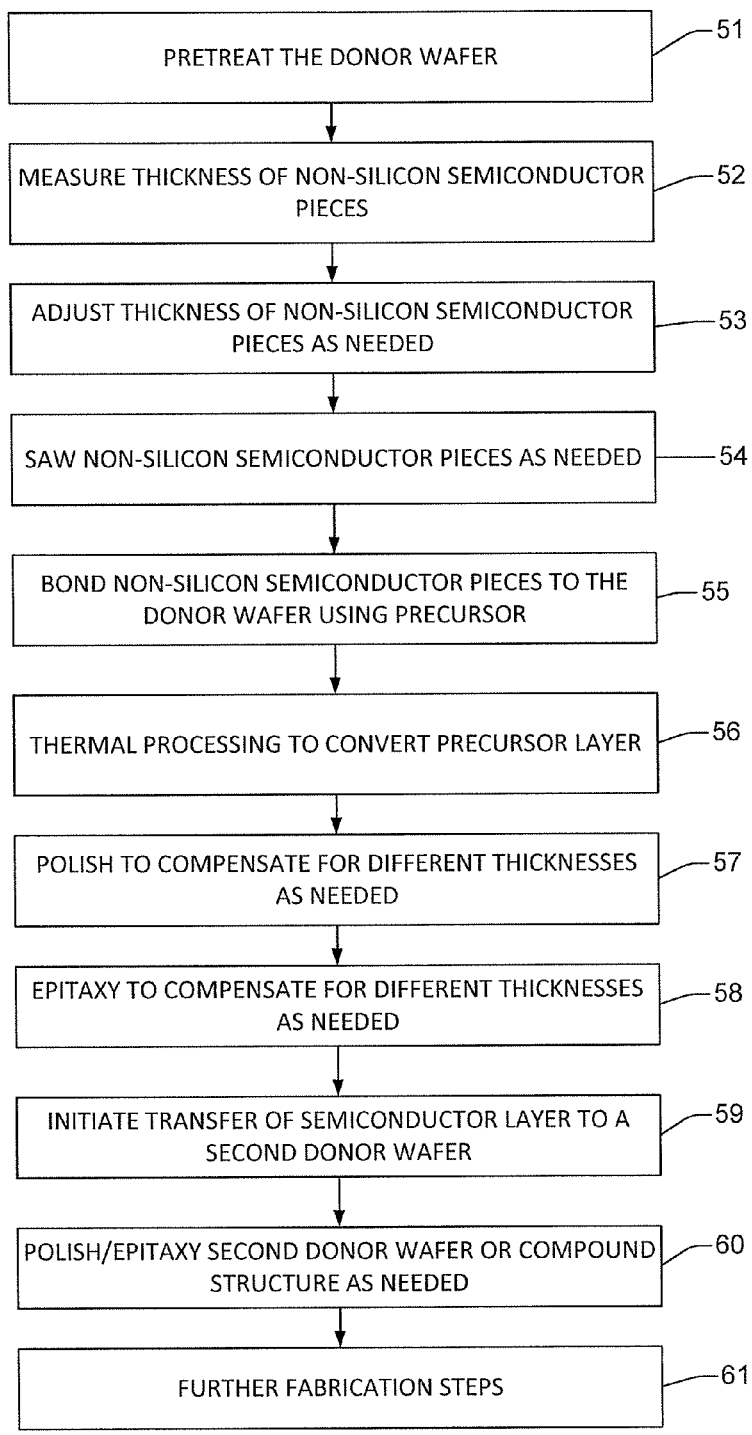
FIG. 6 shows a flow chart for forming compound structures.

FIG. 6 shows a flow chart demonstrating a possible work flow for forming compound structures. The method 50 contains a pretreatment of the graphite donor wafer (polishing, coating) 51. Additionally the wafer thickness of several non-silicon semiconductor pieces 52 may be measured and if necessary, the thickness of the non-silicon semiconductor wafers or pieces may be adjusted by epitaxy 53. If necessary, suitable sawing of these non-silicon semiconductor wafers 54 may be conducted. Further these semiconductor pieces are bonded on the graphite wafer, for example, using adhesive bonding using a ceramic-forming polymer precursor, such as allyl-hydrido-polycarbosilane, while the polymer may contain suitable dopants 55, followed by a high-temperature step (1500° C.-1700° C.), for the complete conversion of the precursor layer into polycrystalline SiC 56. If necessary, polishing of the surface, to compensate different thicknesses 57, additionally if necessary, epitaxial growth 58, is conducted. Further a transfer of a thin semiconductor layer on a second carrier wafer such as graphite by bonding the second carrier wafer 59, may be conducted and if necessary, polishing and epitaxy of donor wafer or second compound structure 60, too. Further process steps for fabrication of components 61 and repeated reuse of the donor wafer may be conducted.

Figure 7:
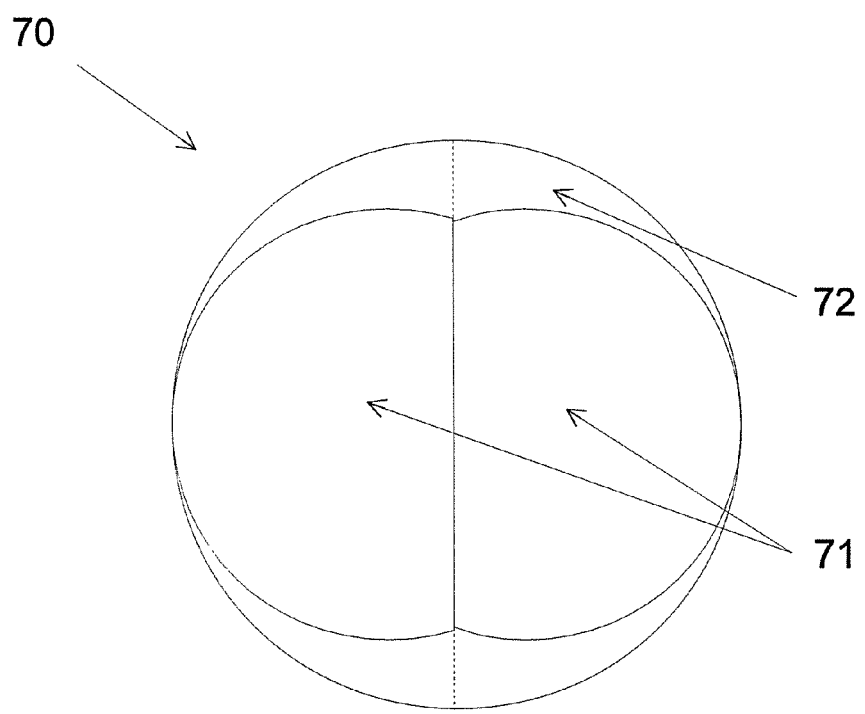
FIG. 7 shows two semiconductor pieces arranged on a carrier wafer.

With reference to FIG. 7, an embodiment of a compound structure 70 is described containing a carrier wafer 72 and at least two semiconductor pieces 71 bonded onto the carrier wafer. The at least two semiconductor pieces 71 are arranged laterally distributed on the carrier wafer 72.

Two or more semiconductor pieces or wafers may be arranged and fixed on the carrier wafer. The carrier wafer may be a wafer, which is suitable to have semiconductor pieces bonded on it.

Fixing may be accomplished by bonding the carrier wafer and the at least two semiconductor pieces together.

In an aspect, an adhesive bonding technique may be used. Therefore the usage of a ceramic-forming polymer precursor may be proposed. For example, the bonding may be carried out with a SiC ceramic-forming polymer precursor.

In an aspect, the semiconductor pieces are distributed adjoining. The surfaces of the compound structure, where no semiconductor has been bonded, corresponds to the areas on the wafer on which no functional components can be produced. Adjoining may help keeping this unusable area small. An aim might be the enlargement of the area of the non-silicon semiconductor substrate (e.g. SiC) by bonding a plurality of wafers/suitable pieces onto a larger carrier wafer (e.g. of graphite), which corresponds to the size of commonly used silicon wafers.

In an aspect, further bonding methods might comprise using an intermediate layer (bonding layer) of carbide forming and/or silicon forming metals with a high temperature stability, like molybdenum (Mo), alternatively silicon dioxide ($SiO_2$) and/or metal silicon double layers.

In an aspect, a method for forming a compound structure is described, where at least two semiconductor pieces are bonded onto a carrier wafer, on which the at least two semiconductor pieces are arranged laterally distributed.

The compound structure 70 may comprise one or more optional, additional features corresponding to one or more aspects mentioned in connection with the proposed concept or one or more embodiments described above.

Example embodiments may further provide a computer program having a program code for performing one of the above methods, when the computer program is executed on a computer or processor. A person of skill in the art would readily recognize that steps of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The non-transitory program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . ." (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A compound structure comprising:
a carrier wafer; and
at least one semiconductor piece bonded onto the carrier wafer by a bonding material obtained by a ceramic-forming polymer precursor.

2. The compound structure, according to claim 1, wherein the at least one semiconductor piece comprises a non silicon semiconductor substrate.

3. The compound structure, according to claim 1, wherein the carrier wafer comprises graphite.

4. The compound structure, according to claim 1, wherein the ceramic-forming polymer precursor comprises a polycarbosilane.

5. The compound structure, according to claim 1, wherein the ceramic-forming polymer precursor comprises allyl-hydrido-polycarbosilane.

6. The compound structure, according to claim 1, wherein the bonding material comprises more than 0.5% hydrogen.

7. The compound structure, according to claim 1, wherein at least two semiconductor pieces are arranged laterally distributed on the carrier wafer.

8. The compound structure, according to claim 1, wherein a size of a surface of the at least one semiconductor piece is less than 90% of a size of a surface of the carrier wafer.

9. The compound structure, according to claim 1, wherein the at least one semiconductor piece comprises at least one straight edge at one side.

10. The compound structure, according to claim 7, wherein a crystal orientation of one of the at least two semiconductor pieces deviates less than 10° from a crystal orientation of the other semiconductor piece of the at least two semiconductor pieces.

11. The compound structure, according to claim 1, wherein the at least one semiconductor piece and the carrier wafer are electrically conductive connected through the bonding material obtained by adhesive bonding using a ceramic-forming polymer precursor.

12. The compound structure, according to claim 1, wherein the bonding material obtained by adhesive bonding using a ceramic-forming polymer precursor contains dopants of a predefined average dopant concentration.

13. The compound structure, according to claim 10, wherein a doping material is chemically bound to a polymer molecule of the ceramic-forming polymer precursor as a functional group or as an independent compound blended with the polymer.

14. A method for forming a compound structure the method comprising:
   providing a carrier wafer; and
   bonding at least one semiconductor piece onto the carrier wafer by using a ceramic-forming polymer precursor.

15. The method according to claim 14, further comprising:
   coating one or both bonding surfaces of the carrier wafer and/or the at least one semiconductor piece with the ceramic-forming polymer precursor; and
   tempering the coated compound structure between 200 to 700° C.

16. The method according to claim 15, wherein the tempering takes place in an atmosphere of nitrogen.

17. The method according to claim 14, the method further comprising:
   bonding at least a second semiconductor piece onto a carrier wafer; and
   equalizing the thickness of at least two semiconductor pieces, until a deviation of less than 0.5 µm among them is achieved.

18. The method according to claim 14, the method further comprising transferring of a semiconductor layer of the at least one semiconductor piece onto a second carrier wafer.

19. The method according to claim 18, wherein the transfer is performed by bonding an opposite side of the at least one semiconductor piece onto a second carrier wafer and splitting the at least one semiconductor piece along an internal splitting boundary so that a part of the at least one semiconductor piece remains on the first carrier wafer and another part of the at least one semiconductor piece remains on the second carrier wafer.

20. The method according to claim 19, the method further comprising depositing an epitaxial layer onto at least one of the remaining parts of the at least one semiconductor piece.

21. The method according to claim 19, wherein one of the remaining parts of the at least one semiconductor piece after depositing an epitaxial layer has a predefined thickness according to a voltage class of a semiconductor device to be formed on the compound structure.

22. A compound structure comprising:
   a carrier wafer; and
   at least two semiconductor pieces bonded onto the carrier wafer, wherein the at least two semiconductor pieces are arranged laterally distributed on the carrier wafer,
   wherein a crystal orientation of one of the at least two semiconductor pieces deviates less than ten degrees from an other crystal orientation of an other semiconductor piece of the at least two semiconductor pieces.

* * * * *